United States Patent [19]

Watanabe

[11] Patent Number: 4,794,564

[45] Date of Patent: Dec. 27, 1988

[54] NONVOLATILE SEMICONDUCTOR MEMORY INCLUDING MEANS FOR DETECTING COMPLETION OF WRITING OPERATION

[75] Inventor: Takeshi Watanabe, Tokyo, Japan

[73] Assignee: NEC Corporation, Tokyo, Japan

[21] Appl. No.: 83,472

[22] Filed: Aug. 10, 1987

[30] Foreign Application Priority Data

Aug. 8, 1986 [JP] Japan .................................. 61-186313

[51] Int. Cl.$^4$ ............................................. G11C 11/34
[52] U.S. Cl. ..................................... 365/184; 365/185; 365/189
[58] Field of Search ............... 365/182, 184, 185, 189, 365/230

[56] References Cited

U.S. PATENT DOCUMENTS 4,583,205 4/1986 Watanabe ............................. 365/189
4,692,904 9/1987 Sato et al. ......................... 365/189 X Primary Examiner—Joseph A. Popek
Attorney, Agent, or Firm—Sughrue, Mion, Zinn, Macpeak, and Seas

[57] ABSTRACT

A semiconductor memory includes memory transistors each having a floating gate is disclosed. This memory is equipped with a detection circuit for detecting a change in the threshold voltage of a selected memory transistor caused by the application of a programming voltage thereto and means responsive to an output of the detection circuit for stopping the application of the programming voltage to the selected memory transistor. A power consumption is thereby reduced in a data writing mode.

9 Claims, 4 Drawing Sheets

NONVOLATILE SEMICONDUCTOR MEMORY INCLUDING MEANS FOR DETECTING COMPLETION OF WRITING OPERATION

BACKGROUND OF THE INVENTION

The present invention relates to a semiconductor memory and more particularly to a nonvolatile semiconductor memory in which each memory cell includes a memory transistor having a floating gate.

In a semiconductor memory of this type, data-writing is carried out by applying a high programming voltage between a control gate and a drain of a selected memory cell to inject carriers of holes or electrons to the floating gate thereof. A time period for completing carrier injection into the floating gate (called hereinafter "injection period") is determined by a device structure of the memory transistor such as a thickness of a gate insulating film, a transistor size, etc.

The semiconductor memory according to prior art does not have means for detecting completion of the carrier injection. For this reason, a programming time period during which the high programming voltage is applied between the control gate and drain of the memory cell is designed to be considerably long as compared to the injection period in order to ensure the data writing. An unnecessary power is thereby consumed during the programming time period after the undetected completion of injection. Moreover, an address cannot be changed until the programming time period elapses, so that a large time is required in total to write data into all of the memory transistors.

SUMMARY OF THE INVENTION

Accordingly, an object of the present invention is to provide a semiconductor memory in which a power consumption in a data writing period is reduced.

Another object of the present invention is to provide a semiconductor memory in which a programming time period is made shortened.

A semiconductor memory according to the present invention is characterized by comprising a detecting circuit detecting a change in threshold voltage of a selected memory transistor to which a high programming voltage is applied for writing data thereto and outputting a detection signal and means responsive to the detection signal for stopping the application of the high programming voltage to the selected memory transistor.

When the memory transistor is injected at its floating gate with the carriers by the programming voltage, the threshold voltage thereof is changed and this change can be detected at a source thereof. The detection circuit monitors the source potential of the selected memory transistor to thereby produce the detection signal representative of the completion of carrier injection into the memory transistor. The programming voltage is thereby removed to reduce a power consumption. The detection signal can be supplied to a data programming equipment which is provided outside of the memory. The programming equipment responds to the detection signal to supply a new address and a new data to the memory. The programming time periods for each selected memory cell and for the memory in total are both thereby shortened.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENT

Figure 1:
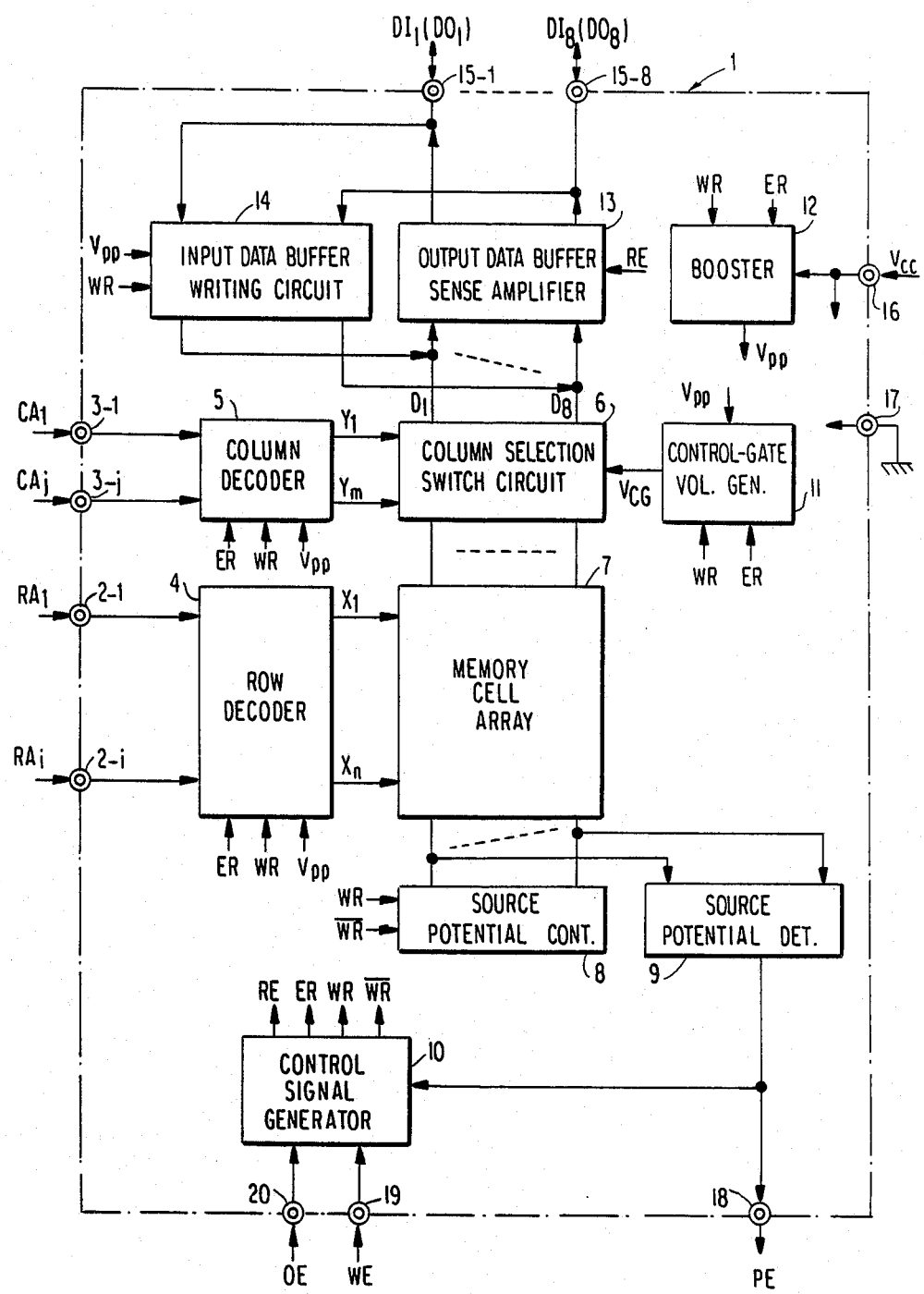
FIG. 1 is a block diagram showing an embodiment of the present invention.

Referring to FIG. 1, a semiconductor memory according to an embodiment of the present invention is shown as an integrated circuit device 1. Three operation modes of data-writing, data-reading and data-erasing are controlled by the combination of logic levels of two control signal WE and OE supplied respectively to terminals 19 and 20 from an externally provided controller (not shown). In the data-writing operation mode, the control signals WE and OE take a high level and a low level, respectively. A control signal generator 10 responds to these levels of the signals WE and OE to generate a high level writing-signal WR, a low level reading-signal RE and a low level erasing-signal ER. A signal $\overline{WR}$ takes an inverted level of the writing-signal WR, i.e. the low level. A sense amplifier/output data buffer 13 is inactivated by the low-level reading-signal RE. On the other hand, an input buffer/writing-circuit 14 is activated by the high level signal WR to introduce data signal $DI_1$ to $DI_8$ to be written, which are supplied respectively to data input/output terminals 15-1 to 15-8. A booster 12 is activated by the high level writing-signal WR to boost a power voltage $V_{cc}$ of 5 V applied to a first power supply terminal 16, so that a high voltage $V_{pp}$ of about 20 V is generated. The power voltage $V_{cc}$ is supplied to the respective circuit blocks. A second power supply terminal 17 is grounded. The high voltage $V_{pp}$ is supplied to the input data buffer/writing-circuit which in turn supplies the $V_{pp}$ level or ground level to data lines $D_1$ to $D_8$ in accordance with logic levels of the data signals $DI_1$ to $DI_8$, respectively. Row address signals $RA_1$ to $RA_i$ and column address signals $CA_1$ to $CA_j$ ar supplied to address terminals 2-1 to 2-i and 3-1 to 3-j, respectively. A row decoder 4 receives the row address signals $RA_1$ to $RA_i$ and the high level writing-signal WR and changes one of decoded signals $X_1$ to $X_n$ to the $V_{pp}$ level. Similarly, a column decoder 5 changes one of decoded signals $Y_1$ to $Y_m$ to the $V_{pp}$ level. A control-gate voltage generator 11 responds to the high level writing signal WR and generates a ground level (0 V) control-gate voltage $V_{CG}$ which is in turn supplied via a column selection switch circuit to a memory cell array 7. Thus, selected memory cells within the cell array 7 are connected to the data lines $D_1$ to $D_8$ through the switch circuit 6 and written with the data $DI_1$ to $DI_8$.

In a data-reading operation mode, the control signals WE and OE take the low level and the high level, respectively. The control signal generator 10 generates a high level reading-signal RE. The writing signal WE and erasing signal ER both take the low level. The sense amplifier/output data buffer 13 is thereby activated, while the input data buffer/writing-circuit 14 and the booster 12 are inactivated. Since the signals WR and ER are the low level, one of the decoded signals $X_1$ to $X_n$ and one of the decoded signals $Y_1$ to $Y_m$ take the $V_{cc}$ level. The circuit 11 supplies a reading-voltage as a control-gate voltage $V_{CG}$ to the memory cell array 7 through the switch circuit 6. Thus, the data programmed in the selected memory cells appear the data lines $D_1$ to $D_8$ and are then outputted to the data input-/output terminals $DO_1$ to $DO_8$ via the sense amplifier/-data output buffer as output data signals $DO_1$ to $DO_8$.

In the data-erasing operation mode, both of the control signals WE and OE take the high level. The control signal generator 10 generates a high level erasing-signal ER, a low level writing-signal RE and a low level reading-signal RE. The sense amplifier/data output buffer 13 and the data input buffer/writing circuit 14 are both inactivated. The booste 12 generates the high voltage $V_{pp}$ in response to the high level erasing-signal ER. The control-gate voltage generator 11 generates an erasing voltage of the $V_{pp}$ level as the control-gate voltage. The row decoder 4 changes one of the decoded signals $X_1$ to $X_n$ to the $V_{pp}$ level and the column decode 5 changes one of the decoded signals $Y_1$ to $Y_m$ to the $V_{pp}$ level. Thus, the data of the selected memory cells are erased.

Figure 4:
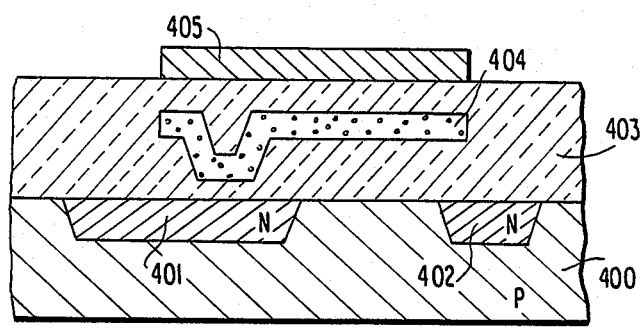
FIG. 4 is a cross-section view of a memory transistor which is employed in the embodiment.

The memory cell array 7 has a plurality of memory cells arranged in a matrix form, each of which includes a known memory transistor shown in FIG. 4. Formed in a silicon substrate 400 of one conductivity type (a P-type in this embodiment) are drain and source regions 401 and 402 of the opposite conductivity type (i.e., an N-type). A silicon oxide film 403 is formed in the surfaces of the substrate 400 and the drain and source regions 401 and 402. A floating gate electrode 404 is buried in the oxide film 403 and a portion thereof very closes to the drain region 401. A control gate electrode 405 is formed on the oxide film 403.

Figure 5:
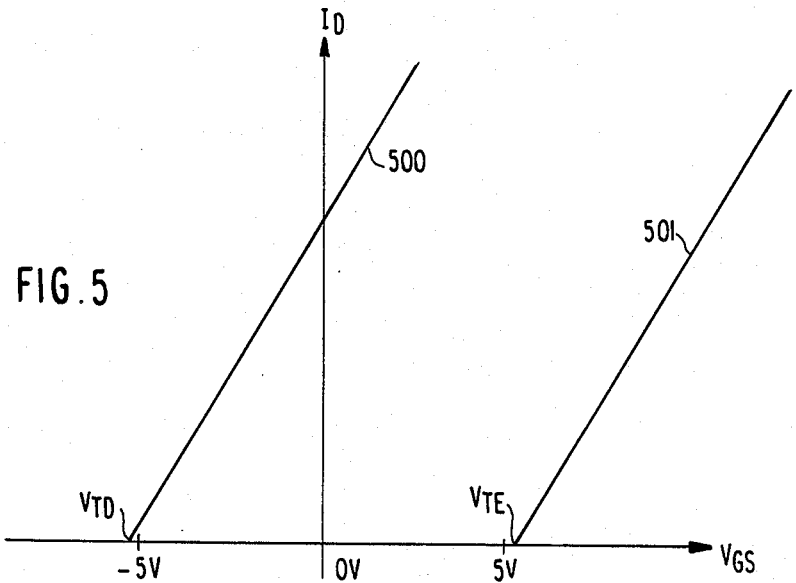
FIG. 5 is a graph showing a drain current $I_D$ to a control gate-source voltage $V_{GS}$ of a programmed memory transistor and an erased memory transistor.

In the data writing operation, the drain region 401 is applied with the $V_{pp}$ voltage and the control gate 405 is applied with the ground voltage generated from the control-gate voltage generator 11 (FIG. 1). As a result, a strong electric field occurs in a direction from the drain region 401 to the control gate 405. Electrons in the floating gate 404 are thereby released toward the substrate 400 through a very thin oxide film (so-called tunnel oxide film) between the drain region 401 and the floating gate 404, whereas holes are catched in the floating gate 404. Thus, the floating gate 404 is charged positively and a channel region is formed in the substrate 400 to connect the drain region 401 and the source region 402 with each other. Even if the control-gate voltage and the drain voltage are removed, the positive charging of the floating gate is maintained and the channel region does not disappear. That is, the memory transistor is changed from an enhancement type to a depletion type by the data programming. The characteristic of a drain current $I_0$ to a control gate-source voltage $V_{GS}$ of the programmed memory transistor is shown in FIG. 5 by a line 500. Since the programmed memory transistor is a depletion type, a drain current $I_D$ flows therethrough even when $V_{GS}$ 0 V. A threshold voltage of the programmed memory transistor is denoted by $V_{TD}$ and takes about $-5$ V.

In the data erasing mode, the $V_{pp}$ voltage is supplied to the control gate 405 from the control-gate voltage generator 11 and the ground voltage is supplied to the drain region 401. The strong electric field occurs from the control gate 405 to the drain region 401. Electrons are thereby injected through the tunnel oxide film to the floating gate 404. Thus, the channel region disappears and the erased memory transistor returns to an enhancement type transistor. The $V_{DS}-I_D$ charactrristic of the erased memory transistor is shown by a line 501 in FIG. 5. A threshold voltage of the erased memory transistor is denoted by $V_{TE}$ and takes about 5 V.

In the data reading operation, an intermediate voltage between the threshold voltages $V_{TD}$ and $V_{TE}$, 1 V for example, is generated by the control-gate voltage generator 11 and then supplied to the control gate 405 of the selected memory transistor. When the programmed memory transistor is selected, its drain current flows.

The present invention utilizes the above-mentioned fact that the threshold voltage of the memory transistor is changed from the $V_{TE}$ value ($+5$ V) to the $V_{TD}$ value ($-5$ V) by the date programming. The source of the memory transistor is usually grounded directly. Since the source potential of the memory transistor is thus clamped at the ground level, it has been impossible to detect the threshold change. In the semiconductor memory circuit according to the present invention, the change in the threshold voltage appears as a change of the source potential of the memory transistor and the source potential change is monitored to detect the completion of the data programming.

More specifically, the semiconductor memory 1 shown in FIG. 1 further comprises a source potential control circuit 8 and a source potential detection circuit 9 in accordance with the present invention. The source potential control circuit 8 connects the source of each memory transistor in the cell array 7 to the ground only in the data-reading and data-erasing operation modes and disconnects it therefrom in the data-writing operation mode. The source potential detection circuit 9 monitors the change in the source potential of the memory cell and produces a high level writing-end signal PE when the source potential exceeds a predetermined level. This signal PE is supplied to the control signal generator 10 and further outputted to a terminal 18 to which an externally provided programming controller (not shown) is connected.

Figure 2:
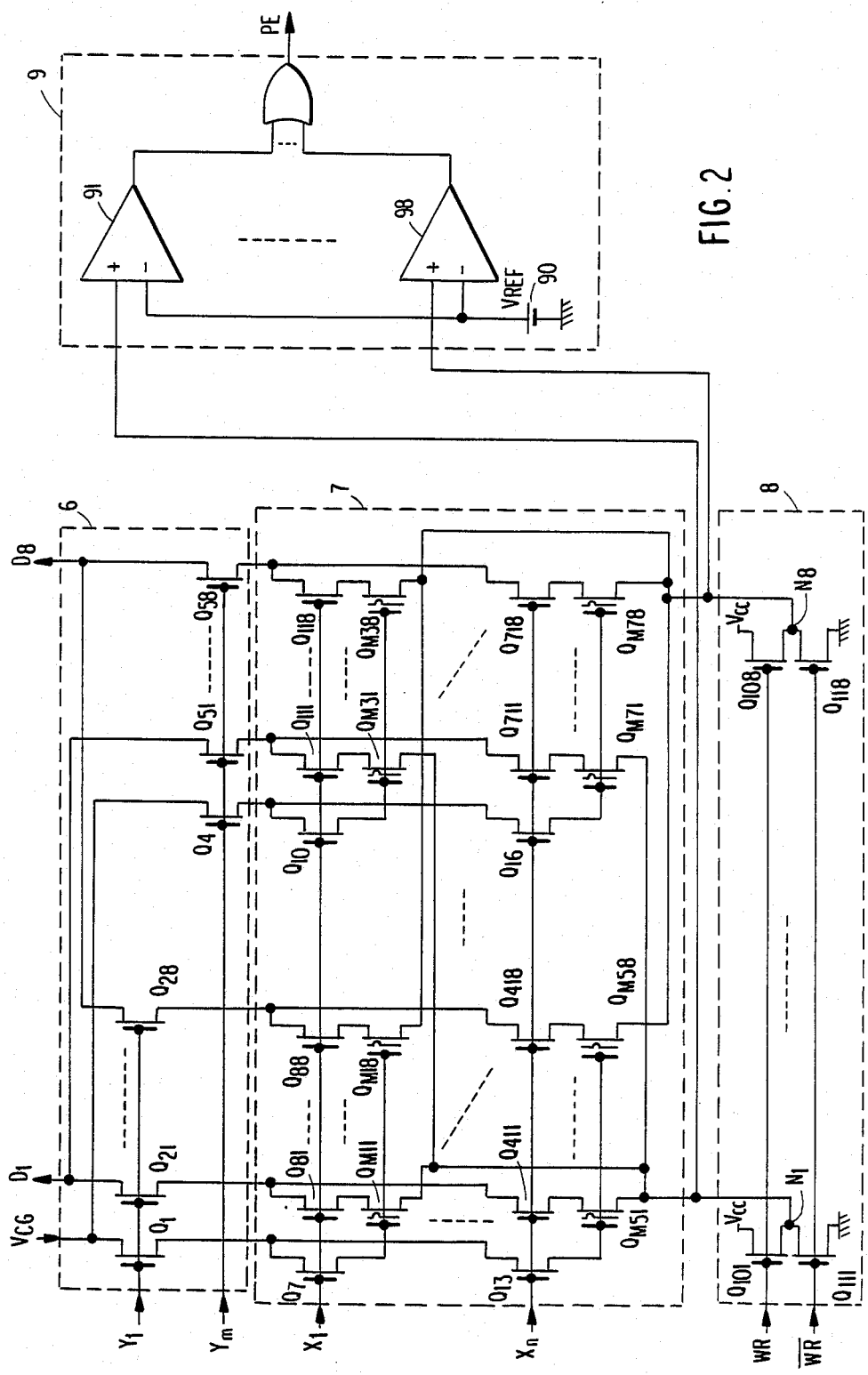
FIG. 2 is a circuit diagram representing a source potential control circuit, a source potential detection circuit, a memory cell array and a column selection switch circuit shown in FIG. 1.

FIG. 2 shows a detailed circuit diagram of the source potential control circuit 8 and the source potential detection circuit 9. The column selection switch 6 and the memory cell array 7 are also shown therein. All the transistors shown are of an N-channel type. When the row and column decoders 4 and 5 change respectively the decoded signals $X_1$ and $Y_1$ to a selection level in response to the row and column address signals $RA_1$ to $RA_i$ and $CA_1$ to $CA_j$, transistors $Q_{81}$ to $Q_{88}$, $Q_{111}$ to $Q_{118}$ and $Q_{21}$ to $Q_{28}$ are turned ON. Accordingly, eight memory transistors $Q_{M11}$ to $Q_{M18}$ are selected and connected to the data lines $D_1$ to $D_8$, respectively. Since transistors $Q_1$ and $Q_7$ are turned ON by the decoded signals $X_1$ and $Y_1$, the voltage $V_{CG}$ generated by the control-gate voltage generator 11 is applied to the control gates of the selected memory transistors $Q_{M11}$ to $Q_{M18}$. The voltage $V_{CG}$ is the ground level in the data-writing mode. The data lines $D_1$ to $D_8$ are supplied with the $V_{pp}$ level or the ground level in accordance with the input data signal $DI_1$ to $DI_8$. The sources of the memory transistors $Q_{M11}$ to $Q_{M18}$ are connected to nodes $N_1$ to $N_8$, respectively, in the source potential control circuit 8 which includes transistors $Q_{101}$ to $Q_{108}$ each connected between each of the nodes $N_1$ to $N_8$ and the power terminal $V_{cc}$ and transistors $Q_{111}$ to $Q_{118}$ each connected between each of the nodes $N_1$ to $N_8$ and the ground terminal. The writing-signal WR is supplied in common to gates of the transistors $Q_{101}$ to $Q_{108}$ and its inverted signal $\overline{WR}$ is supplied in common to gates of the transistors $Q_{111}$ to $Q_{118}$. In the data-writing mode, the signal WR takes the high level and the inverted signal $\overline{WR}$ takes the low level. The transistors $Q_{111}$ to $Q_{118}$ are thereby turned OFF to disconnect the nodes $N_1$ to $N_8$, that is, the sources of the memory transistors $Q_M$, from the ground. The transistors $Q_{101}$ to $Q_{108}$ are turned ON, so that a potential that is lower than the high level (5 V) of the signal $\overline{WR}$ by the threshold voltage (2 V) of each of the transistors $Q_{101}$ to $Q_{108}$, i.e. 3 V, appears at each of the nodes $N_1$ to $N_8$. Assuming that the $V_{pp}$ level is applied only to the first data line $D_1$, the floating gate of the memory transistor $Q_{M11}$ releases electrons (or is injected with holes), so that a caannel region is formed between the drain and source thereof. The memory transistor $Q_{M11}$ is thus programmed and changed to a depletion type. A drain current flows through the memory transistor $Q_{M11}$ to charge the node $N_1$. The potential at the node $N_1$ is thereby raised. Since the potential raising of the node $N_1$ makes the source-gate voltage of the transistor $Q_{101}$ smaller than the threshold voltage thereof, the transistor $Q_{101}$ is turned OFF to disconnect the node $N_1$ from the power terminal $V_{cc}$ as well. When the node $N_1$ is charged up to such a potential that is higher than the gate potential (0 V) of the memory transistor $Q_{M11}$ by the absolute value of the threshold voltage $V_{TD}$ (−5 V) of the programmed memory transistor, the drain current stops to flow through the transistor $Q_{M11}$. That is, the source potential of the memory transistor $Q_{M11}$ is raised to 5 V by the data writing. Tnus, the threshold voltage change of the memory transistor caused by the data writing appears as the source potential change thereof.

The nodes $N_1$ to $N_8$ are connected respectively to noninverting input terminals of comparators 91 to 88 in the source potential detection circuit 9, inverting input terminals thereof being supplied with a reference voltage $V_{REF}$ from a reference voltage source 90. The reference voltage $V_{REF}$ is designed to be an intermediate level of a potential before data-writing and a potential after data-writing at each node N. In this embodiment, the reference voltage $V_{REF}$ is 4 V. Accordingly, each of the comparators 91 to 98 produce a low level output before data-writing, and the comparator 91 produces a high level output after data-writing. The outputs of the comparators 91 to 98 are supplie to an OR gate 99. Thus, a high level signal PE is generated as a data-writing end signal from the source potntial detection circuit 9 when the data-writing completes. Instead of the comparators 91–98, inverters having a threshold voltage of 4 V may be used.

Figure 3:
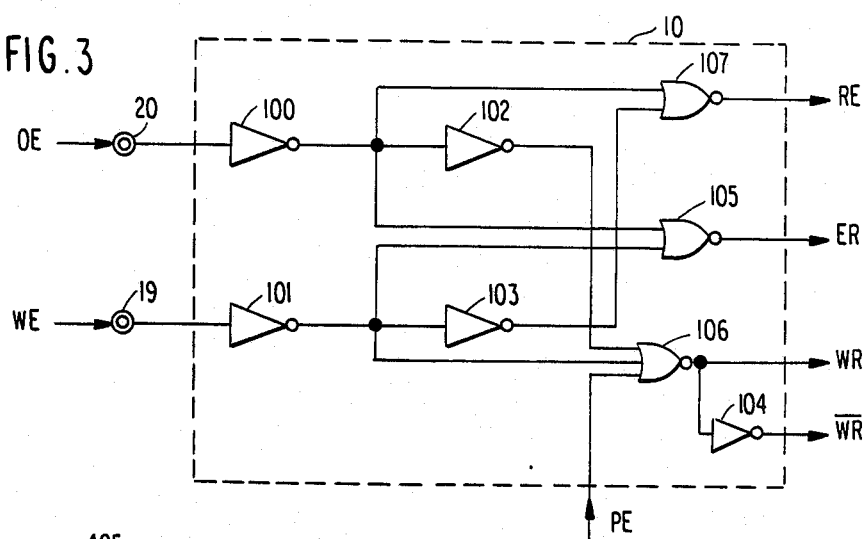
FIG. 3 is a circuit diagram representing a control signal generator shown in FIG. 1.

The data-writing end signal PE is supplied to the control signal generator 10 which includes five inverters 101 to 104 and three NOR gates 105 to 107 as shown in FIG. 3. It will be understood from this drawing that only one of the writing-signal WE, the reading-signal RE and the erasing-signal ER takes the high level in accordance with the operation mode. The NOR gate 106 producing the writing-signal WR receives the data-wiiting end signal PE as its third input. Accordingly, the writing-signal WR is changed to the low level irrespective of the control signals WE and OE when the data-writing end signal PE is generated. As a result, the booster 12 and the input data buffer/writing circuit 14 are both inactivated and the row and column decoders 4 and 5 change the selection levels of the decoded signals $X_1$ and $Y_1$ to the $V_{cc}$ level. Thus, the programming high voltage is stopped to generate and an unnecessary power consumption is prevented.

The data-writing end signal PE is further supplied through the terminal 18 to the programming controller (not shown). This controller thereby changes the row and column address signals $RA_1$ to $RA_i$ and $CA_1$ to $CA_j$ and supplies new input data signals $DI_1$ to $DI_8$ to the terminals 15-1 to 15-8, respectively. The data programming time period is thereby shortened.

The present invention is not limited to the above embodiment, but may be applied to a nonvolatile semiconductor memory of a type in which the threshold voltage of a memory transistor is changed by data-programming. In a case where the externally provided programming controller supplies a $V_{pp}$ voltage to the semiconductor mmemory 1 shown in FIG. 1 in order to omit the booster 12, a switching circuit is provided between a $V_{pp}$ receiving terminal and each of the circuit blocks 4, 5, 11 and 14 and is controlled to be off-state by the data-writing end signal PE.

What is claimed is:

1. A semiconductor memory comprising a plurality of memory transistors, means responsive to a set of address signals for selecting at least one of said memory transistors, means for applying a programming voltage to the selected memory transistor, a threshold voltage of each of said memory transistors being changed when said programming voltage is applied thereto, means coupled to said selected memory transistor for detecting the change in the threshold voltage thereof to produce a detection signal, and means responsive to said detection signal for stopping the application of said programming voltage to the selected memory transistor.

2. The memory as claimed in claim 1, wherein each of said memory transistors has a control gate, a floating gate, a drain and a source.

3. The memory as claimed in claim 1, further comprising an output terminal through which said detection signal is outputted externally.

4. A semiconductor memory comprising a plurality of memory transistors each having a control gate, a floating gate, a drain and a source, means response to a set of address signalsffor selecting at least one memory transistor, means for applying a programming voltage between said control gate and said drain of said at least one memory transistor to charge said floating gate thereof at a predetermined value, means coupled to said source of said at least one memory transistor for detecting a potential change at said source caused by a change in a threshold voltage of said at least one memory transistor and thereby producing a detection signal, and means responsive to said detection signal for preventing said programming voltage from being applied to said at least one memory transistor.

5. The memory as claimed in claim 4, further comprising means activated in a data-reading mode for reading data of said at least one memory transistor and means activated in said data-reading mode for connecting said source of said at least one memory transistor to a reference terminal to clamp said source to a reference potential at said reference terminal.

6. A semiconductor memory comprising a plurality of memory transistors each having a control gate, a floating gate, a drain and a source, an address decoder responding to a set of address signals for selecting at least one of said memory transistors, a data writing circuit activated in a data writing mode and supplying a writing voltage between said control gate and said drain of the selected memory transistor, a reference terminal, a source potential control circuit disconnecting said source of said selected memory transistor from said reference terminal in said data writing mode, a source potential detection circuit comparing a potential at said source of said selected memory transistor with a reference voltage and producing an output signal when said potential exceeds said reference voltage, and means responsive to said output signal for inactivating said data write circuit.

7. The memory as claimed in claim 6, wherein said source potential detection circuit connects said source of said selected memory transistor to said reference terminal in a data reading mode.

8. The memory as claimed in claim 7, wherein said source potential detection circuit includes a first transistor connected between a voltage terminal and said source and turned ON in said data writing mode and OFF in said data reading mode and a second transistor connected between said reference terminal and said source and turned OFF in said data writing mode and ON in said data reading mode.

9. The memory as claimed in claim 8, wherein said first transistor is changed to the OFF state irrespective of said data writing mode when said potential at said source is raised.

* * * * *

UNITED STATES PATENT AND TRADEMARK OFFICE
CERTIFICATE OF CORRECTION

PATENT NO. : 4,794,564
DATED : December 27, 1988
INVENTOR(S) : WATANABE

It is certified that error appears in the above-identified patent and that said Letters Patent is hereby corrected as shown below:

COLUMN 5, LINE 40      Delete "Tnus" and insert --Thus--

COLUMN 5, LINE 55      Delete "supplie" and insert --supplied--

COLUMN 6, LINE 1      Delete "wiiting" and insert --writing--

COLUMN 6, LINE 52      Delete "signalsffor" and insert --signals for--

Signed and Sealed this

Eighth Day of August, 1989

Attest:

DONALD J. QUIGG

Attesting Officer      Commissioner of Patents and Trademarks